(12) United States Patent
Andersen et al.

(10) Patent No.: US 10,050,589 B2
(45) Date of Patent: Aug. 14, 2018

(54) STARTUP POP MINIMIZATION (71) Applicant: ICEpower a/s, Søborg (DK)

(72) Inventors: Kennet Skov Andersen, Søborg (DK); Eskil Jørgensen, Vaerløse (DK)

(73) Assignee: ICEpower a/s, Søborg (DK)

( * ) Notice: Subject to any disclaimer, the term of this patent is extended or adjusted under 35 U.S.C. 154(b) by 0 days.

(21) Appl. No.: 15/528,927

(22) PCT Filed: Sep. 24, 2015

(86) PCT No.: PCT/EP2015/071938
§ 371 (c)(1),
(2) Date: May 23, 2017

(87) PCT Pub. No.: WO2016/082972
PCT Pub. Date: Jun. 2, 2016

(65) Prior Publication Data
US 2017/0338777 A1    Nov. 23, 2017

(30) Foreign Application Priority Data

Nov. 26, 2014 (DK) ................................ 2014 00683
Jun. 17, 2015 (DK) ................................ 2015 00346

(51) Int. Cl.
H03F 1/30     (2006.01)
H03F 3/183    (2006.01)
H03F 3/217    (2006.01)

(52) U.S. Cl.
CPC ............ *H03F 1/305* (2013.01); *H03F 3/183* (2013.01); *H03F 3/217* (2013.01); *H03F 2200/03* (2013.01)

(58) Field of Classification Search
CPC ...................................................... H03F 1/305
See application file for complete search history.

(56) References Cited

U.S. PATENT DOCUMENTS

2007/0139103 A1    6/2007 Roeckner

FOREIGN PATENT DOCUMENTS

WO      WO 00/27028        5/2000

OTHER PUBLICATIONS

International Search Report and Written Opinion dated Dec. 3, 2015 for PCT application No. PCT/EP2015/071938 filed Sep. 24, 2015 which is the parent application for the instant application; 9 pages.

*Primary Examiner* — Patricia T Nguyen
(74) *Attorney, Agent, or Firm* — Harness, Dickey & Pierce, P.L.C.; Anthony G. Fussner (57) ABSTRACT

A switching power conversion system and a method for start-up pop minimization in an audio amplifier assembly are disclosed. The switching power conversion system comprises a forward path including a compensator, a switching power stage and a demodulation filter. The system further comprises a DC-servo and a pre-charging circuit and a sequence control unit configured for providing a start-up sequence where the compensator and DC-servo are correctly biased and a bootstrap capacitor within the switching power stage is charged before the switching power stage is started. Hereby, it is e.g. possible to minimize the audible start-up pop in audio amplifier assemblies.

11 Claims, 8 Drawing Sheets

Fig. 6

STARTUP POP MINIMIZATION

This patent application is a U.S. national stage filing under 35 U.S.C. § 371 of International Application No. PCT/EP2015/071938 filed Sep. 24, 2015 (published as WO 2016/082972 on Jun. 2, 2016), which claims priority of Denmark Application No. PA201400683 filed Nov. 26, 2014 and Denmark Application No. PA201500346 filed Jun. 17, 2015. The disclosures of the applications identified in this paragraph are incorporated herein by reference in their entirety.

FIELD OF THE INVENTION

This invention relates to a switching power conversion system such as DC-AC (Direct Current-Alternating Current), DC-DC or AC-AC conversion systems or any combination of the above mentioned. More specifically, the invention relates to startup pop elimination in an audio amplifier.

BACKGROUND

The startup pop elimination system can be a central element of an audio power conversion system.

Most audio power converters are based on a PWM (Pulse Width Modulation) modulator (digital modulator or analogue modulator) that converts a PCM (Pulse Code Modulated) signal received from a source such as a CD-player, or an analogue signal preceded by a D/A (Digital to Analogue) converter, to for instance pulse-width-modulated signals (digital or analogue PWM modulator).

The output signal of the modulator is fed to a power stage where it is amplified. A typical power converter includes a switching power conversion stage, a filter and an analogue control system.

At start-up of the audio power conversion system a general problem is the presence of an audible signal at the output of the system even though there is no input signal applied to the audio power conversion system. The signal at the output at start-up is called pop.

A contributing source of the start-up pop can be transients when the control system is started from a saturated position.

When the amplifier starts up the control system will find its correct bias value. It is therefore desired that the control system is correctly biased before startup.

In WO 2008/072212 the close down pop is minimized by including a parallel power stage with a switch in serial at the output. This implementation is complex since one more power stage is needed.

U.S. Pat. No. 6,538,590 describes a system using a serial resistor for ramping up. Not for a system with a control loop.

US 2007/0139103 describes a system for quiet power up and power down of an audio amplifier, however it is only applicable in digital systems.

There is therefore a need for an improved system and method for minimizing the start-up pop often present in audio power conversion systems.

SUMMARY OF THE INVENTION

It is therefore an object of the present invention to provide a system for an audio amplifier assembly which alleviates all or at least some of the above-discussed drawbacks of the presently known systems.

This object is achieved by means of a switching power conversion system for an audio amplifier assembly as defined in the appended claims.

According to one aspect of the present invention, there is provided a switching power conversion system for startup pop minimization in an audio amplifier assembly, said system comprising:

a forward path including a compensator, a switching power stage for amplifying an output signal from the compensator, and a demodulation filter for filtering an output signal from the switching power stage and providing an amplified output, said switching power stage including a bootstrap capacitor and a pre-charging circuit for charging the bootstrap capacitor;

a DC-servo connected between the amplified output and an input of the compensator, thereby enabling reduction of offset voltages in the amplified output;

a signal path connecting the output of the compensator to the DC-servo; and a sequence control unit configured for:
ensuring correct biasing of the compensator and DC-servo at start-up;
charging said bootstrap capacitor by controlling said pre-charging circuit in said power stage; and
after said correct biasing is ensured and said bootstrap capacitor is charged, starting said switching power stage.

The present invention is based on the realization that if the output of the compensator is connected to the input of the DC servo (DC-servo) before startup of the power stage, it makes it possible to get the control system out of saturation and correctly biased before startup of the power stage, thereby removing a contributing source to the start-up "pop". The present invention thus provides for a simplified and a more cost-efficient alternative to previous known systems for minimizing the start-up "pop".

Further the inventors have realized that, at startup, the driver stage boot strap capacitor is normally charged by first having a low (sometimes referred to as negative) first pulse with a forced width. When the control system is biased correctly before start up, the first pulse after start-up can be either high (sometimes referred to as positive) or low, without generating an audible "pop". This is also enabled by the fact that the invention also includes a pre-charge circuit of the boot strap capacitor in the driving stage which makes it possible to start up the power stage with a first high pulse or a first low pulse with small/short width. This is generally not possible in self oscillating systems.

Further, in one exemplary embodiment said signal path further comprises a switch for connecting or disconnecting the DC servo from the output of the compensator, and wherein said sequence control unit is further configured for:

closing said switch at start-up, thereby connecting the DC-servo to the output of the compensator and ensuring correct biasing of the compensator and the DC-servo at start-up;

simultaneously opening said switch and starting said switching power stage.

This is because that when the amplifier is running normally it is desired that the influence from the input from the compensator output is as little as possible. Thus, by adding a switch to the signal path the output from the compensator to the DC-servo is more or less completely attenuated. In the present context the term "switch" is to be understood as a device having a transfer function that can be either 0 dB (i.e. no attenuation through the device) and substantially −∞dB (i.e. a very high attenuation through the device).

According to another aspect of the present invention there is provided a method for minimizing start-up pop in an audio amplifier assembly having a switching power conversion system comprising:

a forward path including a compensator, a switching power stage for amplifying an output signal from the compensator, and a demodulation filter for filtering an output signal from the switching power stage and providing an amplified output, said switching power stage including a bootstrap capacitor and a pre-charging circuit for charging the bootstrap capacitor;

a DC-servo connected between the amplified output and an input of the compensator, thereby enabling reduction of offset voltages in the amplified output;

a signal path connecting the output of the compensator to the DC-servo, wherein said method comprises the steps of:

ensuring correct biasing of the compensator and the DC-servo at start-up, thereby bringing the DC-servo out of saturation;

charging said bootstrap capacitor;

starting said switching power stage, after said correct biasing is ensured and said bootstrap capacitor is charged.

With this aspect of the invention, similar advantages and preferred features are present as in the previously discussed aspect of the invention.

The invention may advantageously be used for improved start-up in any audio amplifier assembly, in particular high precision DC-AC power conversion systems such as in high efficiency audio amplification.

BRIEF DESCRIPTION OF THE DRAWINGS

For exemplifying purposes, the invention will be described in closer detail in the following with reference to embodiments thereof illustrated in the attached drawings, wherein.

DETAILED DESCRIPTION

In the following detailed description, currently preferred embodiments of the present invention will be described. However, it is to be understood that features of the different embodiments are exchangeable between the embodiments and may be combined in different ways, unless anything else is specifically indicated. Even though in the following description, numerous specific details are set forth to provide a more thorough understanding of the present invention, it will be apparent to one skilled in the art that the present invention may be practiced without these specific details. In other instances, well known constructions or functions are not described in detail, so as not to obscure the present invention.

Figure 1A:
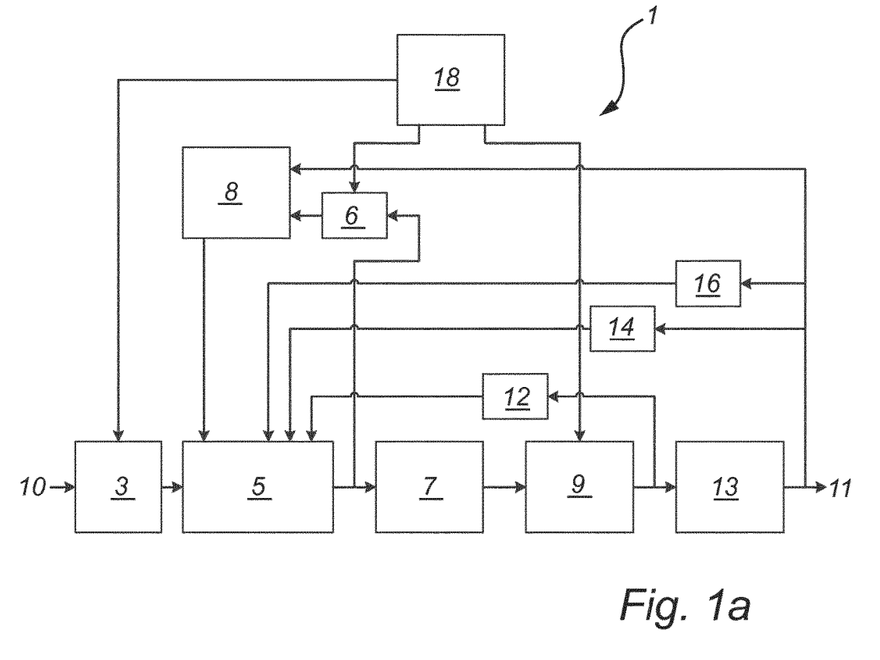
FIG. 1a illustrates a block diagram representation of a switching power conversion system in accordance with an embodiment of the present invention.

FIG. 1a shows a block diagram 1 of an embodiment of the invention which will be described in greater detail in the following. The system in FIG. 1 comprises a switching power conversion system including a sequence controller 18 controlling the sequence of the upstart, a DC-servo 8 having input from the output 11 of the amplifier and from the output of a switch 6, the switch 6 being connected to the output of the compensator 5, feedback filters 12, 14, 16 filtering the feedback signals for the control loop, attenuator 3 and clipper 3 that attenuates and clips the input signal 10, compensator 5 shapes the control loop of the amplifier 1, comparator 7, power stage 9 including pre-charge circuit (not shown in FIG. 1) for charging the high side boot strap capacitor before startup and a demodulation filter 13.

The pop minimization can be done by the following sequence:

Firstly, the input signal 10 should be as close to zero as possible, this can be done by a clipper 3 and/or an attenuator 3.

In step two, for having the amplifier control loop in balance at startup the compensator 5 output is connected to the DC servo 8 input by a switch 6, this way the compensator 5 and the DC servo 8 can be biased correctly before startup of power stage 9.

In step three, the power stage 9 must be capable of starting up with either a negative first pulse or a positive first pulse. To make it possible to start up with a positive first pulse the high side boot strap capacitor must be charged.

In step four, the switch 6 connecting the output of the compensator 5 to the input of the DC-servo 8 is opened at the same time as the amplifier power stage 9 is started up.

In step five, the clipper 3 stops clipping and the attenuator 3 stops attenuating.

Lastly, the amplifier (switching power conversion system) 1 runs normally.

In general applications, when the power stage 9 is switching normally, the bootstrap capacitor is charged via a diode when the output pulse is low. Therefore, if there is no pre-charging of the bootstrap capacitor being performed, the first pulse needs to be negative. In a case where a self-oscillating control system is being used with a single ended power stage, the switching power conversion system will never start if the first pulse is positive. In other applications, which don't use self-oscillating control systems, the switching power conversion system will always eventually start because it is forced to switch and therefore a negative pulse will follow the (possibly initial) high pulse, and thereby enabling the charging of the bootstrap capacitor.

However, if the power stage 9 is forced to start-up with a first negative pulse with a certain width, it will often lead to a signal at the output 11 of the amplifier, a "pop". The width of the pulse depends on the capacitance of the bootstrap capacitor that needs to be charged during this negative period. A high capacitance value is desirable because the bootstrap voltage can then be held for a longer time when there is a long positive pulse, for example because of a clipped high positive signal at the output 11 of the amplifier. In these types of "forced systems" it can be said that the forced negative pulse will cause a considerable "pop". While in a system according to the present invention the width of the pulse is not forced (due to the pre-charging of the bootstrap capacitor), meaning that the control system is not forced and the first pulse can be a high pulse or a short low pulse and thus the system will not present a "pop" at the output/load.

In the above-described sequence, steps two and three can be switched or have an overlap. Moreover, the constriction block 3 can be a clipper or an attenuator or both.

Figure 3A:
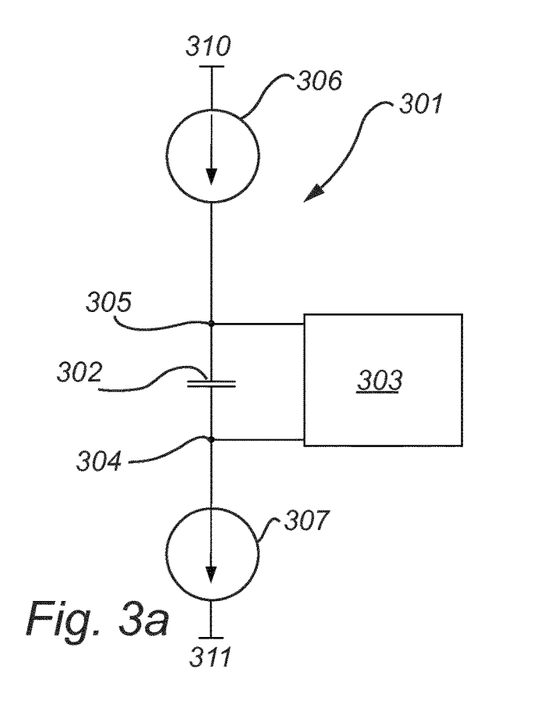
FIG. 3a illustrates a block diagram representation of a bootstrap capacitor pre-charge circuit in accordance with yet another embodiment of the present invention.

Further, regarding the charge of the boot strap capacitor in step three, it can be done by two current sources one putting current into the + (positive node) of the capacitor and one pulling current out of the − (negative node) of the capacitor, explained in more detail in reference to FIG. 3a.

Figure 3B:
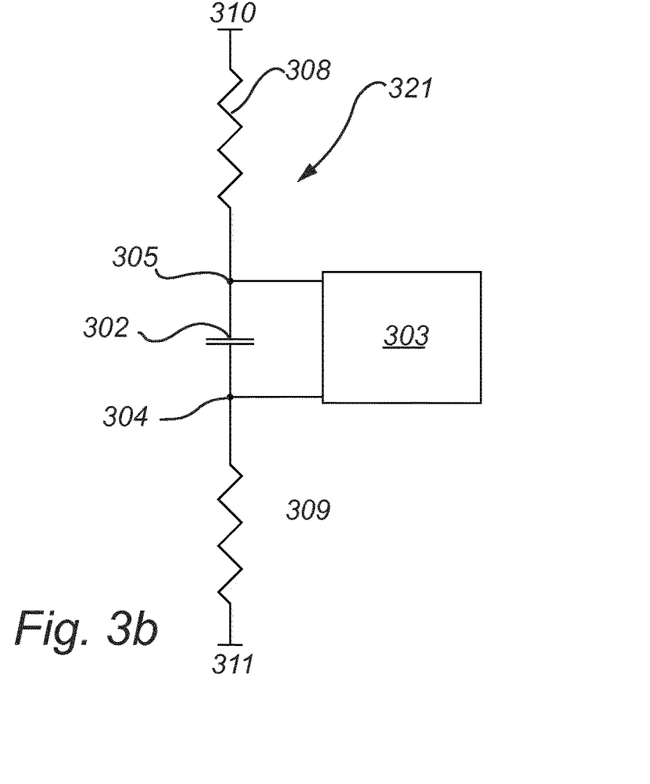
FIG. 3b illustrates a block diagram representation of a bootstrap capacitor pre-charge circuit in accordance with yet another embodiment of the present invention.

The charge can also be done by a resistor connected to the positive power supply and the + (positive node) of the capacitor and a resistor connected to the negative power supply and to the − (negative node) of the capacitor, explained in more detail in reference to FIG. 3b.

Alternatively, the system may comprise an additional switch, so that when the amplifier has started up and is running normally, the DC servo 8 input signal is from the output 11 of the amplifier. There can be a switch in this path so the output signal 11 of the amplifier is not connected to the DC servo 8 in step three when the input of the DC servo 8 is connected to the compensator 5 output. This will ensure that potential noise at the output 11 of the amplifier does not disturb the biasing of the DC-servo 8 in the above-described step two of the sequence.

Figure 1B:
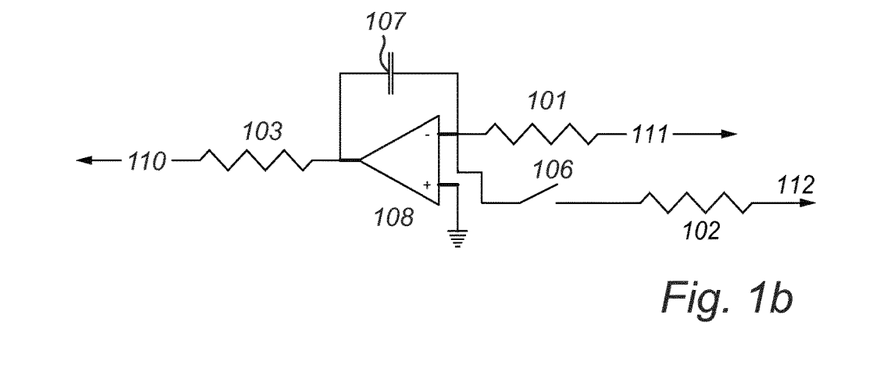
FIG. 1b illustrates a schematic drawing of a DC servo and a switch in accordance with another embodiment of the present invention.

The switch 6 from the output of the compensator 5 to the input of the DC-servo 8 can also be removed and the output of the compensator 5 then connected directly to the DC-servo 8. When both the compensator 5 and the amplifier output 11 are directly connected to the DC-servo 8 without a switch 6 in the path between the compensator 5 output and the DC-servo 8 input there is gain and filter frequency considerations between the compensator 5 output and the amplifier output 11 influence on the DC-servo 8. When the amplifier is running normally it is desired that the influence from the input from the compensator 5 output is as little as possible. In other words, when the amplifier is running normally, a DC offset between the output of the compensator 5 and the output 11 of the amplifier will only be suppressed by the often larger gain in the amplifier output 11 feedback to the DC-servo 8, compared to the gain in the compensator 5 output connected to the DC-servo 8. For example, in some systems the signal swing at the output of the amplifier is about 10 times larger than the output signal swing from the compensator output, so if both of these outputs are connected to the DC-servo with the same resistor values, the feedback from the amplifier output will have about 10 times more gain than the compensator output, which will be acceptable system in some applications. Thus, considerations are taken and depending on the desired application and specifications it is determined if the switch 6 between the compensator 5 and DC-servo 8 can be excluded. In FIG. 1b a rough schematic drawing of a DC-servo and associated components is shown. The output 112 of the compensator and the input of the DC-servo 108 can be connected with a switch 106. The switch can be either closed or opened. Thus, in the present context the term "switch" is to be understood as a device having a transfer function that can be either 0 dB (i.e. no attenuation through the device) and substantially −∞0 dB (i.e. a very high attenuation through the device).

The resistor 101 connected between the output 111 of the amplifier and an input of the DC-servo 108 determines the gain of the DC-servo 108 when the amplifier is running normally. While the resistor 102 connected between the output 112 of the compensator 5 and the switch 106 determines the gain of the DC-servo when the control system is basing during the start-up sequence. Between the output of the DC-servo 108 and an input 110 of the compensator 5 there is a resistor 103 which, together with capacitor 107, contributes to the gain of the DC-servo in both of the above-described situations.

Figure 2:
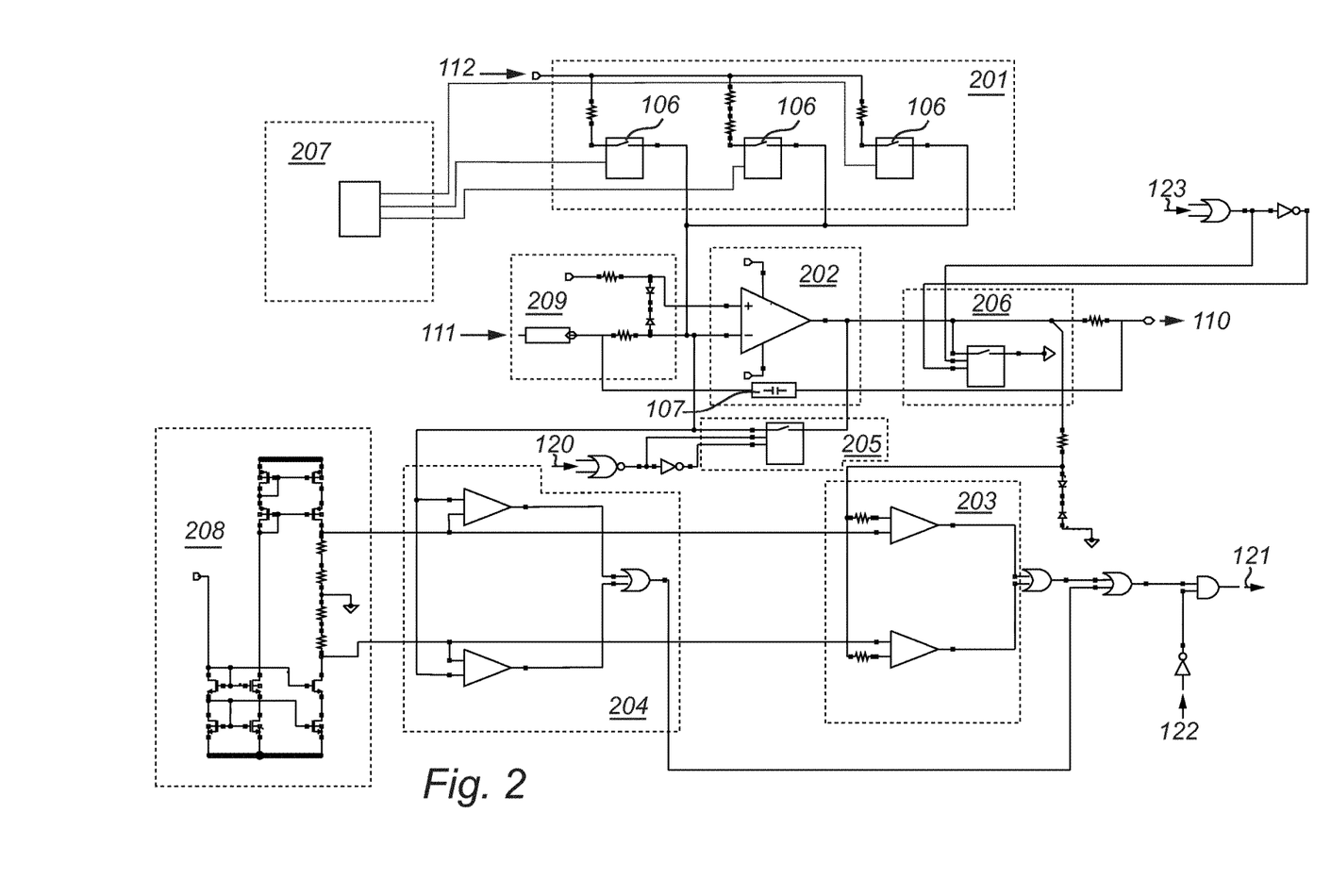
FIG. 2 illustrates a schematic drawing of a DC servo and switch for a DC servo which is connectable to a compensator in accordance with yet another embodiment of the present invention.

In FIG. 2 a detailed schematic of a DC-servo system and a switch in an integrated circuit application is shown. Separate sections 201-209 of the schematic have been marked in order to clarify the circuit in the figure and a brief description of each section will be provided in the following. The DC-servo is provided with three switches in section 201, each having a different resistor value associated with it when connected to the output of the compensator. The decode logic in section 207 is used to select which of the switches and consequently which of the resistor values to be used, depending on the application of the system. The switch and resistor(s) to be used may be selected by an I2C interface (sometimes called inter-integrated circuit, I²C). Section 202 contains the operational amplifier used in the DC-servo and the associated (external) capacitor 107. Section 209 illustrates some ESD (electrostatic discharge) protection components together with a box used to indicate where the output 111 of the amplifier and a resistor (101 in FIG. 1b) may be connected.

Further, a switch that is used to short-circuit the DC-servo capacitor, when the system is not in use, is illustrated in section 205. The aforementioned switch in section 205 is controlled by an input signal 120. Section 204 comprises two comparators in order to protect from DC at the output of the amplifier when the amplifier is disabled. During this measurement, performed by the comparators in section 204, the switch in section 206 shorts the output of the DC-servo and the DC-servo OP-amp in section 202 is disabled. The switch in section 206 is controlled by an input signal 123. The switch Moreover, the above-described configuration (resistor from amplifier output and capacitor at the DC-servo OP amp) creates a low pass filter (RC-filter) for the measurement of the DC level at the output of the amplifier. This is in order to prevent high frequency noise to be detected by the DC-protection in section 204. Section 203 also contains two comparators in order to protect from DC at the output of the amplifier when the amplifier is running normally. The comparators in 203 are measuring if the DC-servo output is above a certain level. In case the DC-servo is saturated it cannot minimize the DC at the output of the amplifier and it is therefore an indication of DC voltage at the output of the amplifier. Both of the DC-protection circuits render in an output signal 121, where an optional input/control signal 122 may be applied for masking the saturation when the DC-servo is initializing, i.e. during start-up. The control signals 120, 122, 123 may be provided from a control unit (not shown) as known in the art.

Section 208 provides a voltage references for the comparators in sections 203 and 204.

FIG. 3a shows a block diagram of an exemplary embodiment of a bootstrap pre-charge circuit 301. This embodiment utilizes current sources 306, 307 or current generators 306, 307 for charging the bootstrap capacitor 302. The current generator 306 is used to provide a first current i1 to the positive side 305 of the bootstrap capacitor 302. A second current generator 307 is used to draw a second current i2 from the negative side 304 of the bootstrap capacitor 302. Preferably the magnitude of the second current i2 is equal to the magnitude of the first current i1. This is because when the negative side 304, is connected to a load, such as e.g. a speaker, (not shown) and for the pre-charge current (i1) not to run through the load and cause the undesired "pop", the current drawing block 307 is connected to the negative side 304.

In FIG. 3b an alternative embodiment of the bootstrap capacitor pre-charge circuit 321 is depicted, in a block diagram representation. Here, the bootstrap capacitor 302 is charged via the resistor 308 which in turn is connected to the positive supply 310. A connection to the negative supply rail 311 from the negative side 304 is made via a resistor 309; in order to draw current similarly to the setup discussed in relation to FIG. 3a, i.e. to prevent pre-charge current from running through a load, such as e.g. a speaker, (not shown) which is connected to the negative side 304. Preferably the current through 308 should be equaled by the current through 309 in order to ensure that no pre-charge current flows through the load.

In FIGS. 4a-5b some more detailed examples of a pre-charge circuit and associated sub-blocks are illustrated in a detailed schematic configuration for integrated circuit applications.

Figure 4A:
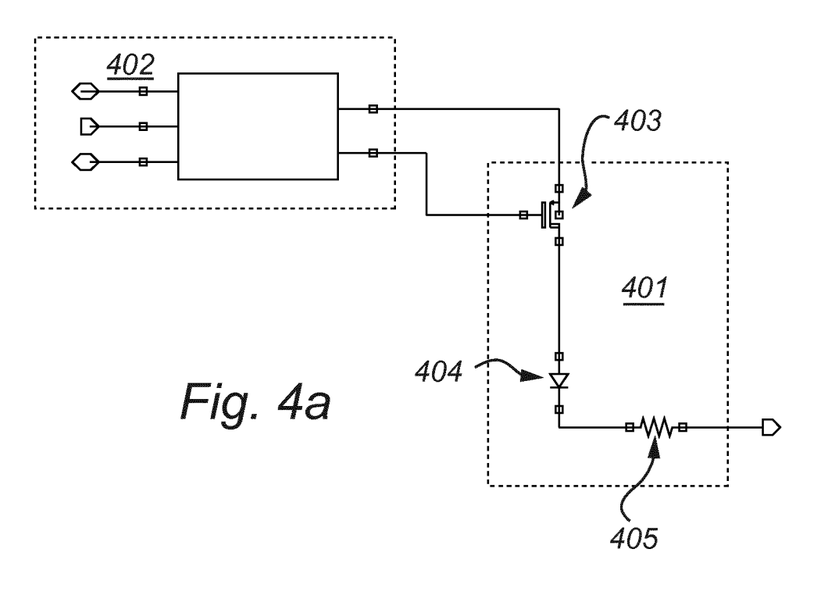
FIG. 4a illustrates a pre-charge circuit of the positive side of the bootstrap capacitor of a driver in accordance with yet another embodiment of the present invention.

FIG. 4a shows a detailed schematic of a pre-charge circuit from the positive supply to the positive side of the bootstrap capacitor in an integrated circuit form. Similarly to the procedure in FIG. 2, the circuit has been divided into sections 401, 402 which will be further described. Section 401 contains a cascade transistor 403 for handling high voltages and a diode 404 for separation from the bootstrap voltage when the bootstrap capacitor is at a high voltage when the power stage is switching, and a resistor 405 for ESD protection. In section 402 the block for the current mirror for the positive side of the bootstrap capacitor can be seen.

Figure 4B:
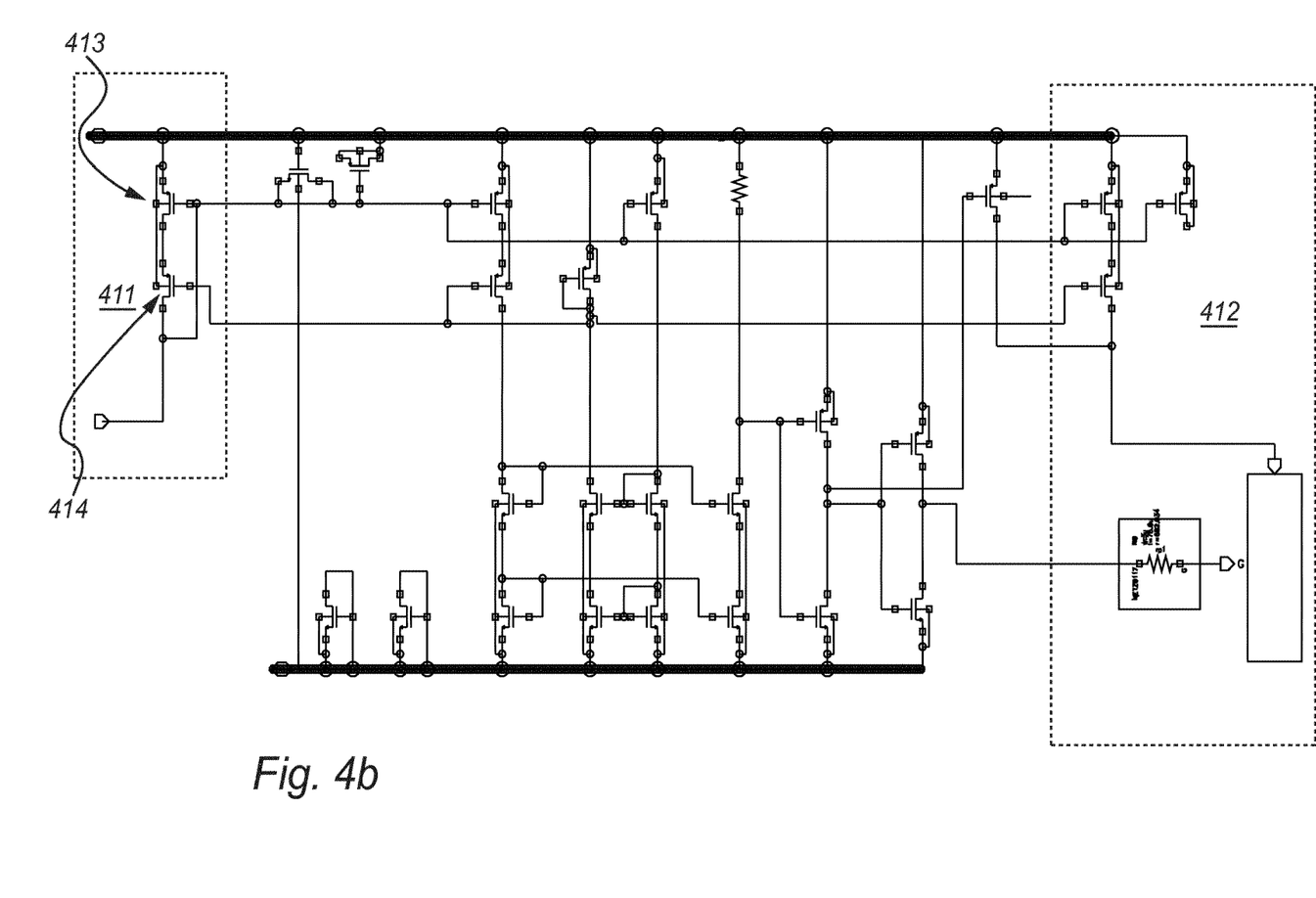
FIG. 4b illustrates a sub-block of the pre-charge circuit in FIG. 4a in accordance with yet another embodiment of the present invention.

FIG. 4b shows a more detailed view of the current mirror block for the positive side of the bootstrap capacitor (402 in FIG. 4a). Section 411 comprises two transistors 413, 414 for receiving the input reference current in the current mirror, and section 412 contains the output transistors for supplying the precharge current from the current mirror.

Figure 5A:
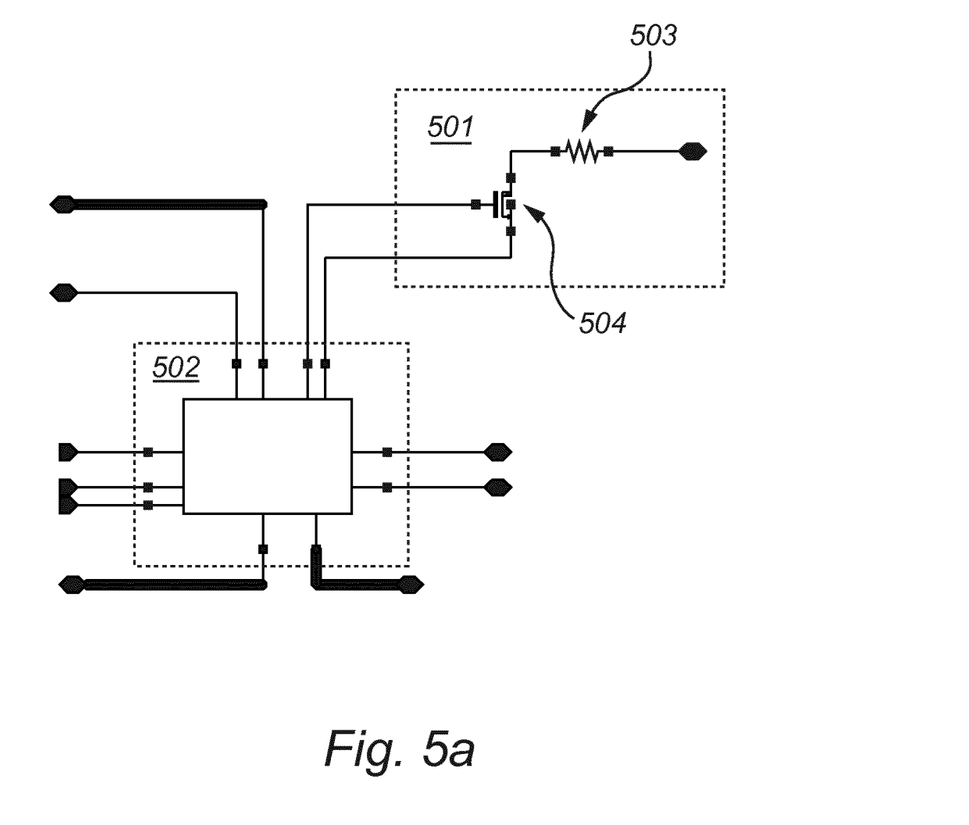
FIG. 5a illustrates a pre-charge circuit of the negative side of a driver in accordance with yet another embodiment of the present invention.

FIG. 5a shows a pre-charge circuit from the negative supply to the negative side of the bootstrap circuit. Section 501 in FIG. 5a, similarly to section 401 in FIG. 4a, contains a cascade transistor 504 that can handle high voltages and a resistor 503 for ESD protection. The circuit in section 502 includes a reference current for the current mirror for the positive side of the bootstrap capacitor and a current mirror for the negative side of the bootstrap capacitor.

Figure 5B:
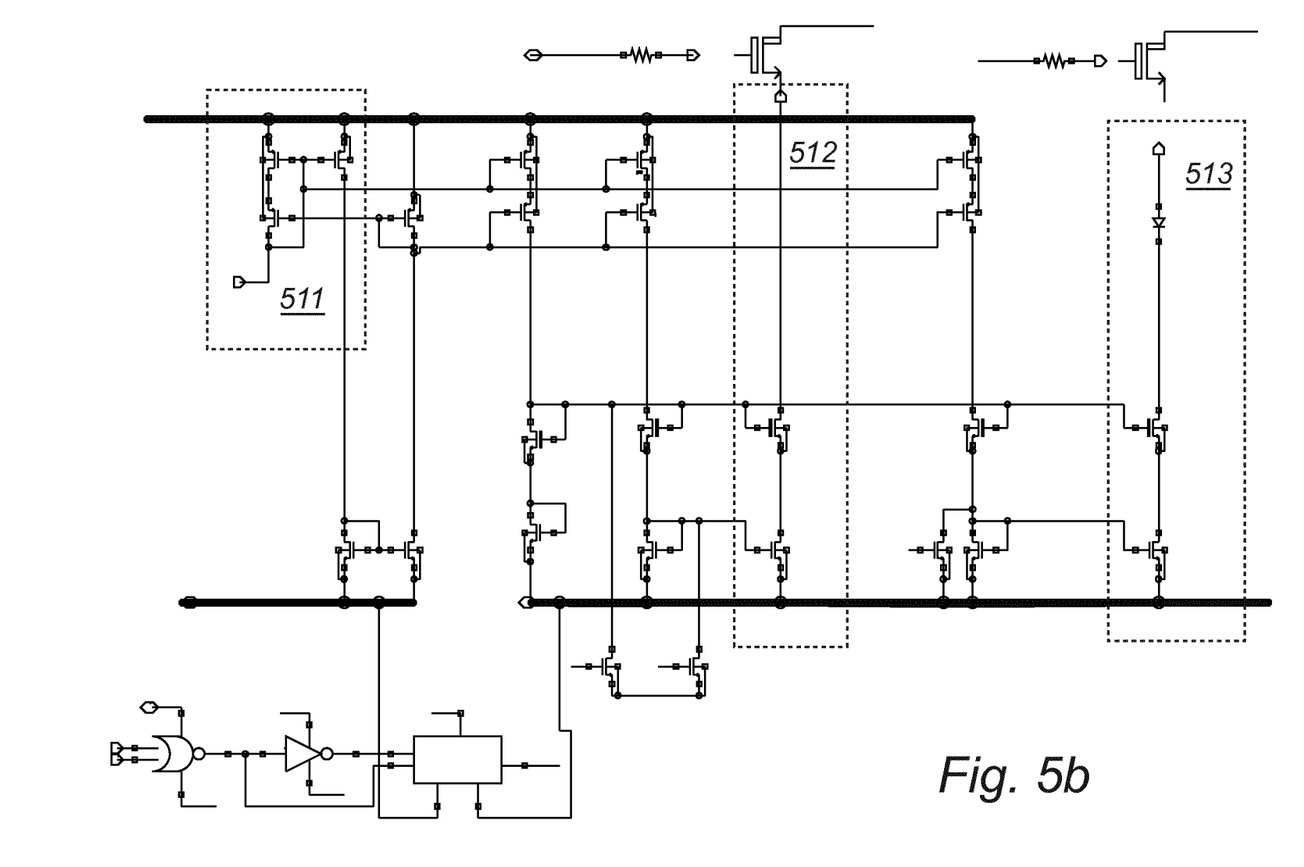
FIG. 5b illustrates a sub-block of the pre-charge circuit in FIG. 5a in accordance with yet another embodiment of the present invention.

FIG. 5b illustrates the "inside" of the current mirror block 502 from FIG. 5a. Section 511 contains transistors for receiving an input reference current in the current mirror, section 512 contains transistors for generating a reference current for the current mirror for the positive side of the bootstrap capacitor (see FIGS. 4a-4b), and section 513 comprises transistors for the pre-charge of the negative side of the bootstrap capacitor.

Figure 6:
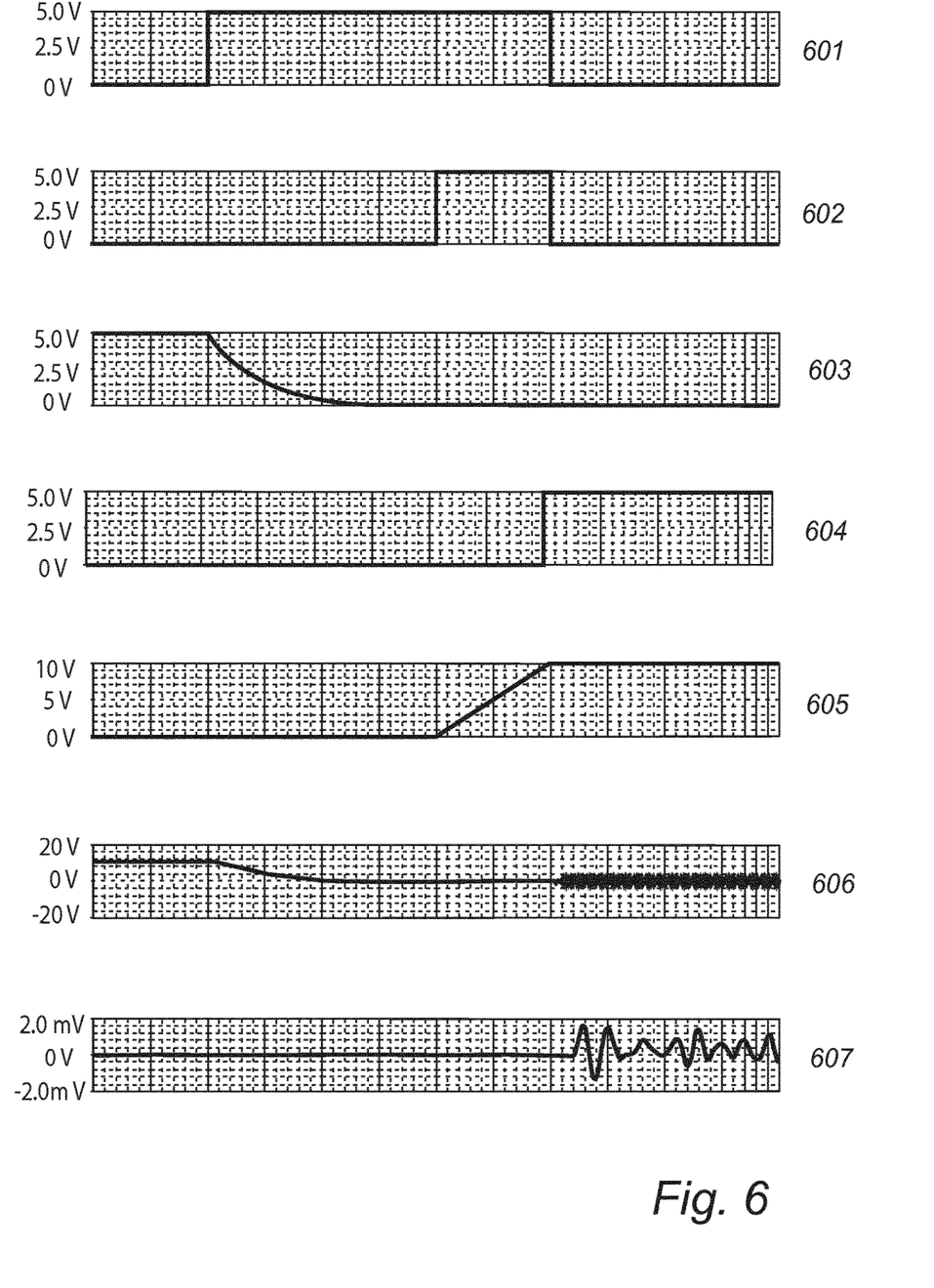
FIG. 6 illustrates a simulation showing voltage signals at different parts of a power conversion system in accordance with yet another embodiment of the present invention.

FIG. 6 illustrates a signal simulation of a system in accordance with an embodiment of the invention. The simulation serves to elucidate the inventive start-up sequence and the different signals are illustrated in voltage graphs which will be explained in the following.

The top window 601 shows the signal from the SCU (Sequence Control Unit) or sequence controller, controlling when the switch for the DC-servo from the compensator is on in the start-up sequence. Window 602 illustrates the signal from the SCU controlling when the bootstrap capacitor is to be pre-charged. Next, one can see the output of the DC-servo in window 603 which indicates that the DC-servo is saturated in the beginning and afterwards biased to a correct bias value after the switch to the DC-servo is closed (window 601), i.e. connection is established between the compensator and DC-servo.

Further, the signal (from the SCU) controlling the activation of the power stage is shown in window 604 and window 605 illustrates the voltage across the bootstrap capacitor in the power stage. Window 606 represents the output of the compensator, where it is indicated that saturation is present in the beginning and that it is biased to a correct bias value after the switch to the DC-servo is closed (window 601).

Lastly, window 607 shows the output signal of the amplifier after it has been filtered through the demodulation filter (low pass filter) and an additional low pass filter for removing switching ripple so that the audio band signal is more visible.

The invention has now been described with reference to specific embodiments. However, several variations of the switching power conversion system are feasible. For example, the system may be applied to several different applications, such as e.g. in two level or multi level modulation, single ended amplifiers, BTL (Bridge Tied Load) dual supply, etc. Further, the DC-servo used is not limited to first order DC-servos but a higher order DC-servo is equally applicable. Such and other obvious modifications must be considered to be within the scope of the present invention, as it is defined by the appended claims. It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting to the claim. The word "comprising" does not exclude the presence of other elements or steps than those listed in the claim. The word "a" or "an" preceding an element does not exclude the presence of a plurality of such elements.

The invention claimed is:

1. A switching power conversion system for start-up pop minimization in an audio amplifier assembly, said system comprising:
   a forward path including a compensator, a switching power stage for amplifying an output signal from the compensator, and a demodulation filter for filtering an output signal from the switching power stage and providing an amplified output, said switching power stage including a bootstrap capacitor and a pre-charging circuit for charging the bootstrap capacitor;
   a DC-servo connected between the amplified output and an input of the compensator, thereby enabling reduction of offset voltages in the amplified output;

a signal path connecting the output of the compensator to the DC-servo; and a sequence control unit configured for:
ensuring correct biasing of the compensator and DC-servo at start-up;
charging said bootstrap capacitor by controlling said pre-charging circuit in said power stage; and
after said correct biasing is ensured and said bootstrap capacitor is charged, starting said switching power stage.

2. The switching power conversion system according to claim 1, wherein said signal path further comprises a switch for connecting or disconnecting the DC-servo from the output of the compensator, and wherein said sequence control unit is further configured for:
closing said switch at start-up, thereby connecting the DC-servo to the output of the compensator and ensuring correct biasing of the compensator and the DC-servo at start-up;
simultaneously opening said switch and starting said switching power stage.

3. The switching power conversion system according to claim 1, wherein said forward path further comprises:
a constriction block for clipping an input signal and feeding the clipped signal to the compensator;
wherein said sequence control unit is further configured for controlling said constriction block to clip the input signal before correct biasing of the compensator and DC-servo has been ensured and to stop the clipping of said input signal after the switching power stage is started.

4. The switching power conversion system according to claim 1, wherein said forward path further comprises:
a constriction block for attenuating an input signal and feeding the clipped signal to the compensator;
wherein said sequence control unit is further configured for controlling said constriction block to attenuate the input signal before correct biasing of the compensator and DC-servo has been ensured and to stop the attenuating of said input signal after the switching power stage is started.

5. The switching power conversion system according to claim 1, further comprising an output switch for connecting or disconnecting the DC-servo from the amplified output, and wherein said sequence control unit is further configured for:
opening said output switch at start-up, thereby disconnecting the DC-servo from the amplified output;
closing said output switch when said power stage is started.

6. The switching power conversion system according to claim 1, further comprising:
a first feedback path connected from the output signal of the switching power stage to the compensator, said first feedback path comprising a first feedback filter for generating a first feedback signal.

7. The switching power conversion system according to claim 1, further comprising:

a second feedback path connected from the filtered output signal of the demodulation filter to the compensator, said second feedback path comprising a second feedback filter for generating a second feedback signal.

8. A method for minimizing start-up pop in an audio amplifier assembly having a switching power conversion system comprising:
a forward path including a compensator, a switching power stage for amplifying an output signal from the compensator, and a demodulation filter for filtering an output signal from the switching power stage and providing an amplified output, said switching power stage including a bootstrap capacitor and a pre-charging circuit for charging the bootstrap capacitor;
a DC-servo connected between the amplified output and an input of the compensator, thereby enabling reduction of offset voltages in the amplified output;
a signal path connecting the output of the compensator to the DC-servo, wherein said method comprises the steps of:
ensuring correct biasing of the compensator and the DC-servo at start-up, thereby bringing the DC-servo out of saturation;
charging said bootstrap capacitor;
starting said switching power stage, after said correct biasing is ensured and said bootstrap capacitor is charged.

9. The method according to claim 8, wherein said signal path further comprises a switch for connecting or disconnecting the DC-servo from the output of the compensator, said method further comprising:
closing said switch at start-up, thereby establishing a connection between the DC-servo and the output of the compensator and ensuring correct biasing of the compensator and the DC-servo at start-up;
opening said switch simultaneously with the step of starting the switching power stage.

10. The method according to claim 8, wherein said forward path further comprises a constriction block for clipping an input signal and feeding the clipped signal to the compensator, wherein said method further comprises the step of:
clipping the input signal before ensuring correct biasing of the compensator and the DC-servo at start-up; and
stopping the clipping of the input signal after the switching power stage is started.

11. The method according to claim 8, wherein said forward path further comprises a constriction block for attenuating an input signal and feeding the attenuated signal to the compensator, wherein said method further comprises the step of:
attenuating the input signal before ensuring correct biasing of the compensator and the DC-servo at start-up; and
stopping the clipping of the input signal after the switching power stage is started.

* * * * *